(12) United States Patent
Rebstock et al.

(10) Patent No.: US 8,777,540 B2
(45) Date of Patent: Jul. 15, 2014

(54) APPARATUS FOR STORING CONTAMINATION-SENSITIVE FLAT ARTICLES, IN PARTICULAR FOR STORING SEMICONDUCTOR WAFERS

(75) Inventors: Lutz Rebstock, Gaienhofen (DE); Michael Meichsner, Moos-Bankholzen (DE)

(73) Assignee: Dynamic Microsystems Semiconductor Equipment GmbH, Radolfzell (DE)

( * ) Notice: Subject to any disclaimer, the term of this patent is extended or adjusted under 35 U.S.C. 154(b) by 941 days.

(21) Appl. No.: 12/104,139

(22) Filed: Apr. 16, 2008

(65) Prior Publication Data

US 2008/0251473 A1    Oct. 16, 2008

Related U.S. Application Data

(63) Continuation of application No. PCT/EP2006/009329, filed on Sep. 26, 2006.

(30) Foreign Application Priority Data

Oct. 17, 2005  (DE) .......... 10 2005 050 555
Jun. 9, 2006   (DE) .......... 10 2006 028 057

(51) Int. Cl.
    *H01L 21/677*  (2006.01)
(52) U.S. Cl.
    CPC ....... *H01L 21/67769* (2013.01); *Y10S 414/137* (2013.01); *Y10S 414/14* (2013.01); *Y10S 414/135* (2013.01)
    USPC ........ 414/217; 414/277; 414/744.5; 414/935; 414/937; 414/940

(58) Field of Classification Search
    USPC ............... 414/217, 221, 744.5, 277
    See application file for complete search history.

(56) References Cited

U.S. PATENT DOCUMENTS

| | | | | |
|---|---|---|---|---|
| 3,169,935 A | * | 2/1965 | Sherliker et al. | 524/472 |
| 4,653,650 A | | 3/1987 | Schülke | |
| 4,886,412 A | | 12/1989 | Wooding et al. | |

(Continued)

FOREIGN PATENT DOCUMENTS

| DE | 103 29 868 A1 | 1/2005 |
|---|---|---|
| DE | 103 50 517 A1 | 6/2005 |

(Continued)

OTHER PUBLICATIONS

Anne M. Murray et al., "Automated Reticle Handling: A Comparison of Distributed and Centralized Reticle Storage and Transport", 2003. pp. 1360-1365.

*Primary Examiner* — Scott Lowe
(74) *Attorney, Agent, or Firm* — Harness, Dickey & Pierce, P.L.C.

(57) ABSTRACT

An apparatus for storing contamination-sensitive flat articles, in particular for storing semiconductor wafers, comprises a plurality of box-like compartments stationary arranged on a fixed mounting rack. The compartments are open on a front side and are arranged in rows and columns side by side and one above the other on the fixed mounting rack. The compartments each have a plurality of slotted holders for receiving the flat articles, and they surround a first handling unit configured for automatically inserting and removing the flat articles into and out of the slotted holders. A closed housing forms a clean room where both the plurality of compartments and the first handling unit are arranged.

21 Claims, 5 Drawing Sheets

(56) References Cited

U.S. PATENT DOCUMENTS

| | | |
|---|---|---|
| 5,022,695 A | 6/1991 | Ayers |
| 5,059,079 A * | 10/1991 | Foulke et al. .................. 414/275 |
| 5,303,482 A | 4/1994 | Yamashita et al. |
| 6,089,377 A * | 7/2000 | Shimizu ........................ 206/711 |
| 6,089,811 A * | 7/2000 | Watanabe et al. ............. 414/269 |
| 6,123,120 A | 9/2000 | Yotsumoto et al. |
| 6,398,476 B1 * | 6/2002 | Ando ............................ 414/282 |
| 6,514,033 B2 | 2/2003 | Sundar |
| 6,885,911 B1 * | 4/2005 | Smith ........................... 700/245 |
| 2002/0009359 A1 | 1/2002 | Sundar |
| 2002/0094257 A1 | 7/2002 | Babbs et al. |
| 2003/0009904 A1 | 1/2003 | Tokunaga |
| 2003/0017034 A1 * | 1/2003 | Davis et al. .................. 414/404 |
| 2003/0091410 A1 | 5/2003 | Larson et al. |
| 2004/0026694 A1 | 2/2004 | Blattner et al. |
| 2004/0037675 A1 * | 2/2004 | Zinger et al. ................. 414/217 |
| 2004/0191028 A1 * | 9/2004 | Tamai ........................... 414/217 |
| 2005/0100435 A1 * | 5/2005 | Dickinson .................... 414/941 |
| 2006/0263176 A1 | 11/2006 | Moran |

FOREIGN PATENT DOCUMENTS

| | | |
|---|---|---|
| EP | 1 037 264 A2 | 9/2000 |
| EP | 1 197 990 A2 | 4/2002 |
| JP | 7-106406 | 4/1995 |
| JP | 10-022359 | 1/1998 |
| JP | 11-307610 | 11/1999 |
| JP | 11-329989 | 11/1999 |
| JP | 2000056200 A | 2/2000 |
| JP | 2000-100920 | 4/2000 |
| JP | 2000-308988 | 11/2000 |
| JP | 2005203498 A | 7/2005 |
| WO | WO 02/05320 A1 | 1/2002 |

\* cited by examiner

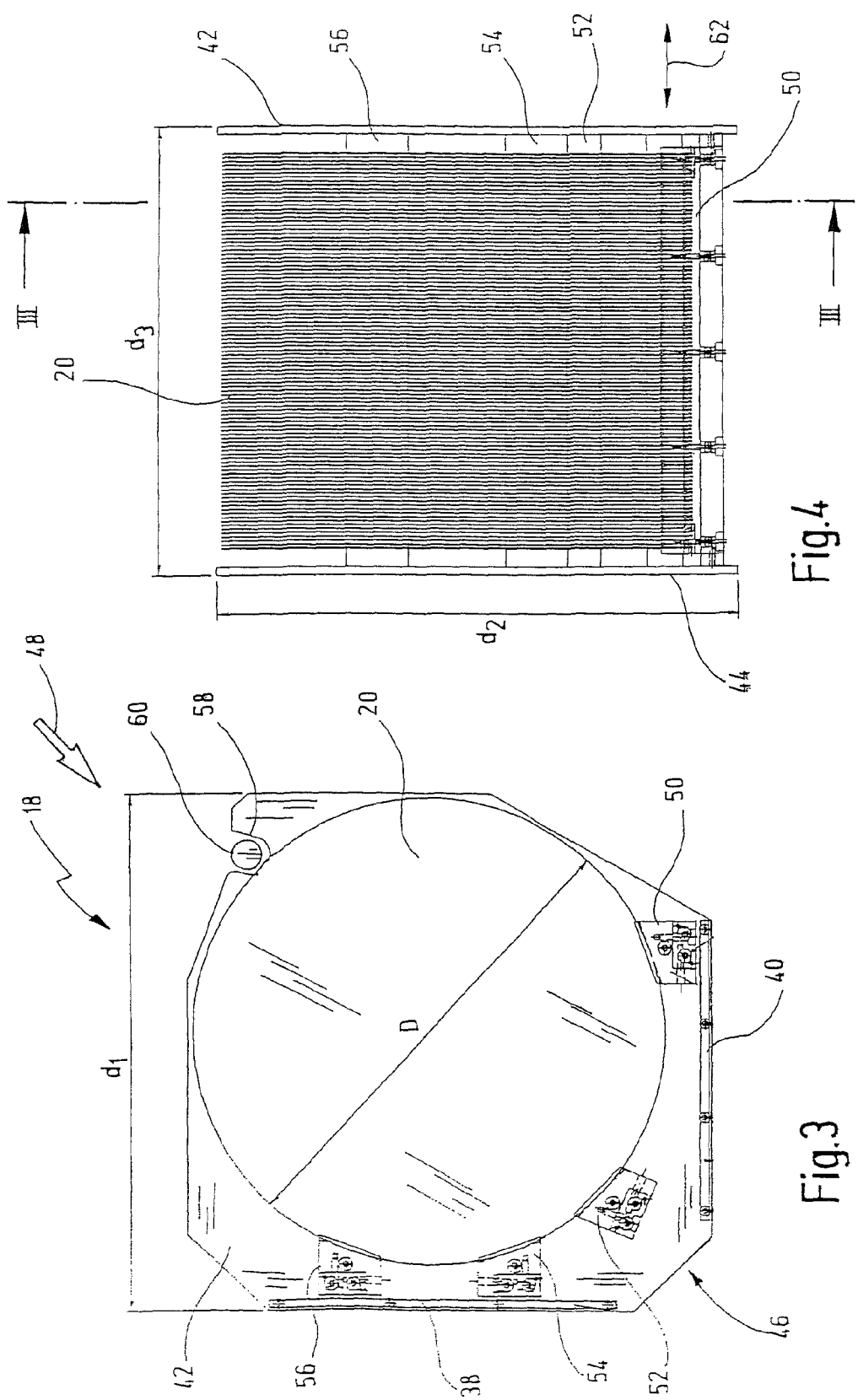

APPARATUS FOR STORING CONTAMINATION-SENSITIVE FLAT ARTICLES, IN PARTICULAR FOR STORING SEMICONDUCTOR WAFERS

CROSS REFERENCES TO RELATED APPLICATIONS

This application is a continuation of international patent application PCT/EP2006/009329, filed on Sep. 26, 2006 designating the U.S., which international patent application has been published in German language as WO 2007/045331 A1 and claims priority from German patent applications DE 10 2005 050 555.4 filed on Oct. 17, 2005 and DE 10 2006 028 057.1 filed on Jun. 9, 2006. The entire contents of these priority applications are incorporated herein by reference.

BACKGROUND OF THE INVENTION

The present invention relates to an apparatus for storing contamination-sensitive flat articles, in particular for storing articles used in the production of semiconductor products and more particularly for storing semiconductor wafers.

The production of large-scale-integrated electronic circuits and other sensitive semiconductor components is nowadays carried out in factories in which so-called semiconductor wafers pass through a plurality of processing steps. Semiconductor wafers are circular disks composed of a semiconductor material, such as silicon, on which microstructures are formed by various exposure, etching and doping processes. The wafer is typically coated with an oxide layer and with a light-sensitive varnish arranged above the oxide layer. The varnish is then exposed through a photomask (the "reticle"). The photomask images the desired microstructure on the wafer. After a development step, the photoresist is removed at the unexposed points, exposing the oxide layer. In a subsequent etching process, the exposed oxide layer (and only this layer) is removed. The semiconductor material, which is now exposed in places, can then have its material characteristics changed by doping processes (deliberate introduction of different material), thus resulting in the desired microstructures. These process steps are typically carried out more than once in different versions until a large-scale-integrated electronic circuit or, for example, a liquid crystal component, has been manufactured.

The majority of these process steps take place in cleanroom conditions, i.e. in environmental conditions which are kept as free as possible from impurities, foreign substances and the like. This is because any contamination of the wafer by other materials can change its material characteristics undesirably, and this can lead to an entire production batch being unusable.

For an efficient production, it is necessary to temporarily store the semiconductor wafers before and after the individual process steps are carried out. Furthermore, semiconductor wafers also have to be stored for other reasons, for example as a stock and as initial material for a new production batch, as "filling material" in order to fill only partially filled production installations (in order, for example to ensure a defined temperature distribution in an oven), or as test wafers for testing a production process. It is important to ensure that the wafers are kept free from contamination during storage times.

In modern factories, wafers are often transported between individual production installations in special transport boxes, which are know as FOUPs (Front Open Unified Pots). Wafers are often also stored in these FOUPs, which have a special cover for closure. The internal and external dimensions of the FOUPs are exactly specified, since automated handling systems are typically used for loading, unloading and transport of the FOUPs. When wafers are stored in FOUPs, the internal and external dimensions of the FOUPs determine the space required and the storage capacity. A storage system for wafers using FOUPs is disclosed, for example, by EP 1 197 990 A2.

DE 103 29 868 A1 discloses a storage system for wafers, wherein the wafers are stored in a horizontal orientation on a carousel, which is kept in clean-room conditions. Horizontal storage of the wafers corresponds to the practice in FOUP-based storage systems, because the automated handling systems for FOUPs are typically configured to insert and remove the wafers in horizontal orientation.

US 2002/0094257 A1 discloses a storage system for reticles, wherein the individual reticles are held in a vertical orientation on carousels arranged one above the other. This document states in an extremely general form that such a system may also be used for storing semiconductor wafers, but without discussing any details or observing differences between wafers and reticles. For example, a reticle has to be protected "only" against dust and other physical particles which can lead to corruption of the microstructure that is imaged in the exposure step. In contrast, semiconductor wafers must also be protected against gaseous substances, which can introduce undesirable doping atoms into the semiconductor material. Furthermore, storage systems for reticles require different handling and storage systems in comparison to wafers, because of the different geometric dimensions.

The storage of wafers and other contamination-sensitive articles outside of FOUPs and other transport containers involves a risk of a single contaminated article contaminating a large number of other articles stored in the same area. On the other hand, the storage of wafers and other contamination-sensitive articles in FOUPs and other transport containers requires a large amount of storage space. This is particularly problematic, because the wafer size in modern semiconductor factories is increasing, because increasingly larger semiconductor wafers are used. By way of example, modern semiconductor factories use wafers with a diameter of 300 mm and require correspondingly large FOUPs, while older production installations generally use 200 mm wafers.

SUMMARY OF THE INVENTION

Against this background, it is an object of the invention to provide for an apparatus for storing contamination-sensitive flat articles, and in particular for storing semiconductor wafers, which apparatus allows space-saving storage and flexible handling at the same time. In particular, the novel apparatus is intended to allow storage of a large number of 300 mm wafers on a small footprint and in clean-room conditions.

According to one aspect of the invention, there is provided an apparatus for storing contamination-sensitive flat articles, comprising a plurality of box-like compartments each having an open front side, the compartments being stationary arranged in rows and columns side by side and one above the other on a fixed mounting rack, and the compartments each having a plurality of slotted holders for receiving a plurality of flat articles, comprising a first handling unit for automatically inserting and removing a flat article into and out of the slotted holders, and comprising a closed housing forming a clean room where both the compartments and the first handling unit are arranged, wherein the plurality of compartments surround the first handling unit on at least two sides.

The novel apparatus therefore makes use of a concept in which the articles to be stored, in particular semiconductor wafers, are mounted virtually open in a clean room where a handling unit for loading and unloading is also located. The first handling unit can therefore easily access the individual articles and quickly place them in the compartments. Furthermore, the novel apparatus is physically quite small due to the open storage concept, i.e. it has a small footprint.

On the other hand, the compartments subdivide the open storage area, thereby considerably reducing the risk of cross-contaminations between the stored articles. Advantageously, the compartments are stationary attached to a stationary or fixed mounting rack, i.e. neither the compartments nor the articles held in them are moved during storage (apart from the movements of the individual articles by means of the handling unit for loading or unloading the compartments). The fixed-position or stationary storage of the articles prevents the articles from rubbing on and/or striking the slotted holders. This considerably reduces the risk of wear and resultant cross-contamination, as well as the risk of damage.

The compartments preferably are box-like storage elements which are open on at least one side (the front side). Their external dimensions are considerably smaller than the standardized dimensions of the known FOUPs. This is possible in an advantageous manner because the first handling unit can be optimally matched to the insertion and removal of articles from the box-like compartments, while FOUPs in contrast must be compatible with a plurality of different handling systems within a semiconductor factory. In an advantageous embodiment, which will be described in more detail further below, the box-like compartments hold semiconductor wafers with a pitch distance of only 2.5 mm, which is considerably less than the pitch distance in standardized FOUPs.

In summary, the novel apparatus combines various aspects of known storage systems, including open storage of contamination-sensitive articles within a "large" clean room, in which the first handling unit is also arranged. On the other hand, the "large" clean room is subdivided by means of the compartments which are separated from each other at the sides, at the top and at the bottom by the corresponding walls of the compartments. Each compartment holds 50 or 100 articles in preferred embodiments. The novel apparatus thus allows space-saving and flexible handling, since the individual compartments can be loaded with the articles as required. The fixed or stationary storage of the articles contributes to safe and contamination-free storage. The object mentioned above is therefore completely achieved.

In a preferred refinement, the articles are held in a vertical orientation in the compartments.

This refinement allows particularly space-saving storage with a very high packing density. This is because the articles, in particular semiconductor wafers, can be gripped when stored vertically by a very narrow gripping element "from the outside" at the edge, whereas the gripping element for horizontal storage must at least partially be moved between the wafers, requiring a corresponding space between them. The pitch distance between the wafers with the novel apparatus can be reduced to about 2.5 mm. The higher packing density leads to a considerable increase in the storage capacity with a small space requirement. Furthermore, the article can be purged very efficiently with a cleaning gas when stored vertically. However, it is also feasible to use the novel storage concept with horizontally held articles.

In a further advantageous refinement, the plurality of compartments surround the first handling unit substantially in a circular shape.

This refinement allows the novel apparatus to be implemented in a particularly space-saving form, while having a large storage capacity at the same time. In addition, this refinement allows very rapid access to the stored articles. A circular arrangement of the compartments is perfect for use of the first handling unit in the form of what is known as a SCARA robot. SCARA robots have an articulated arm which can move only on a horizontal plane, namely radially with respect to the center point of a circle where the articulated arm is mounted for rotation. SCARA robots are very fast and require only a small amount of movement space in comparison to 6-axis robots. This refinement therefore allows a very high storage density with a very small footprint.

In a further refinement, the plurality of compartments define a center point of a circle, with the first handling unit being arranged in the area of the center point of the circle.

This refinement further optimizes the novel apparatus to the use of a physically small and fast SCARA robot, since, in this refinement, the compartments are all arranged on the radial movement path of such a robot. This refinement allows the articles to be placed in store and removed from store very quickly. Furthermore, this simplifies the movement control of the handling unit.

In a further refinement, the articles in the compartments are aligned with respect to the center point of the circle where the first handling unit sits.

This refinement even further simplifies the movement procedures of the first handling unit, and allows even quicker handling of the individual articles. If the articles are mounted in a vertical orientation in the compartments, this results in a further advantage, namely that the articles have a shorter pitch distance on their side facing the first handling unit than on their outside, which is arranged further away from the first handling unit. The articles then approximately form a V-shape with respect to one another in the compartments, thus resulting in a nozzle effect when a cleaning gas flows through the compartments from the outside inwards.

In a further refinement, the first handling unit has an articulated arm adapted to move only on a horizontal plane, with the arm being arranged on a carriage adapted to move in a vertical direction. It is particularly preferable for the first handling unit to be a SCARA robot, which is arranged on the vertical carriage.

The advantages of an SCARA robot have already been explained further above. As an alternative to this, however, the first handling unit could have an arm which is moved on the horizontal plane and in the vertical direction by means of a cross-carriage. These refinements allow a small footprint and rapid access to the individual articles.

In another refinement, the first handling unit is a 6-axis robot.

A 6-axis robot allows very complex movements. As a consequence, the individual compartments may be distributed more flexibly within an available foot-print. Furthermore, the individual compartments can be produced more easily and at a lower cost, particularly if vertical mounting of the articles is desired, because a 6-axis robot can carry out the resulting complex movement paths by itself.

In a further refinement, the apparatus comprises a second handling unit designed to transfer the articles to the surrounding housing or from the surrounding housing. The second handling unit is preferably designed to transfer the articles individually into the surrounding housing and out of the surrounding housing. Furthermore, it is preferable for the second handling unit likewise to be a SCARA robot.

A refinement with at least two handling units initially increases the complexity and thus the costs of the novel apparatus. However, it has been found that, in particular when using two SCARA robots, this allows a physically very small and efficient implementation because, on the one hand, SCARA robots are very fast and, on the other hand, the restricted movement paths of the SCARA robots can be optimally compensated for by the use of two handling units.

In a further refinement, the handling unit comprises a first moving arm having at least two first gripping elements, with the first gripping arm being movable between a horizontal and a vertical holding position.

In this refinement, the first gripping arm is able to move a vertically mounted article to the horizontal position without changing its grip. This is particularly advantageous when the new storage system is used to store wafers, since the wafers are kept horizontal during the normal process procedure, for example by being inserted horizontally into FOUPs. This refinement of the apparatus can easily be integrated into the production procedures of existing factories. Furthermore, the articles can be reoriented by means of the first gripping arm quickly and at low cost.

In a further refinement, the at least two first gripping elements are arranged on legs which cover a circular arc with an angle range of more than 180°. The legs preferably hold the article to be stored just at its edges. Furthermore, it is preferable if the article is held approximately centrally in a plane defined by the legs.

These refinements are particularly advantageous when the new storage system is used for storing wafers or other circular articles in a vertical orientation. The legs then surround the article being held in a circumferential area which covers more than half of the overall circumference. The legs can thus hold the article solely by the force of gravity, i.e. the article need not be clamped using a powerful clamping mechanism. This reduces the risk of damage to the article. Furthermore, if the article is held approximately centrally with respect to the plane defined by the legs, this allows the articles to be packed particularly densely in the individual compartments.

In a further refinement, the handling unit has a second gripping arm with at least two second gripping elements, with the second gripping elements being arranged on an arm part which is located away from a plane defined by the second gripping elements.

A second gripping arm designed in this way is particularly advantageous for picking up articles aligned horizontally from above. In particular, a second gripping arm such as this makes it possible to insert a wafer into a FOUP aligned horizontally. The preferred refinement therefore makes it possible for the handling unit to place a wafer from the store directly into a FOUP. This means that there is no need for what is known as a sorter, which is required for the previous FOUP-based storage systems, in order to combine a production batch in one FOUP.

In a further refinement, the handling unit comprises a mounting bracket having at least two free ends, where the first and the second gripping arms are arranged. The mounting bracket is preferably L-shaped, with the first gripping arm having the capability to rotate about a rotation axis which is parallel to and preferably coaxial to one limb of the L-shaped mounting bracket.

This refinement is a particularly space-saving and low-cost option for arranging the two gripping arms on the handling unit such that they can be operated with a small number of actuators.

In a further refinement, the compartments are detachably attached to the mounting rack, with the housing comprising at least one door which allows direct access to the compartments. The at least one door is preferably arranged in the rear area of the compartments.

This refinement allows convenient access to the compartments in a situation where manual removal is required, for example because of a system failure.

In a further refinement, each compartment has a bottom wall and a rear wall, which are arranged approximately in an L-shape with respect to one another, preferably with an opening remaining between the bottom wall and the rear wall. Each compartment preferably also has side walls, and it is also preferable for all the walls to be sealed such that they are air-tight.

Such compartments are particularly advantageous in order to reduce the risk of cross-contamination between the stored articles. The rear walls mean that the compartments, at least some of which are arranged one above the other, form a "partition wall" between a front and a rear area, with the articles being stored in the front area, i.e. in front of the rear walls. The separate areas can advantageously be used for supplying a cleaning gas, such as filtered and dried air, in a continuous flow to the articles, and to carry it away again. The contamination-sensitive articles are further separated from one another by the bottom walls and the preferred side walls.

In a further refinement, an opening remains in the area between the rear wall and the bottom wall.

An opening in the corner area between the bottom wall and the rear wall allows optimum dissipation of the exhaust air including any contamination without the exhaust air entering one of the other compartments.

In a further refinement, each compartment has a connection for supplying a cleaning gas. It is also preferable if each connection for supplying the cleaning gas is provided with a valve, so that the cleaning gas supply can be individually controlled.

This refinement allows particularly efficient purging with a cleaning gas. The valves allow the gas flow to be matched to the filling of the compartments, thus resulting in a uniform gas flow.

In order to produce the continuous gas flow, a fan is preferably arranged in an area above the compartments, because any contamination is then carried away downwards very efficiently.

In a further refinement, each compartment comprises a locking element for securing the articles in the holders against falling out. In a particularly preferred embodiment, the locking element is a bracket which runs transversely in front of all the articles held in the compartment, and which can be selectively attached to the compartment and/or locked.

This refinement is particularly advantageous when compartments have to be removed from the storage system manually in the event of a system failure.

In a further refinement, the slotted holders in each compartment are in the form of comb-like strips which can be moved in the longitudinal direction (that is to say transversely with respect to the stored articles).

This refinement allows the slot positions in the individual compartments to be adjusted easily and quickly. In particular, the slotted holders in this refinement can be adjusted very easily such that the articles are kept upright and can be removed from the compartments, and inserted into them, without any problems.

It is self-evident that the features mentioned above and those which are still to be explained in the following text can be used not only in the respectively stated combination but also in other combinations or on their own without departing from the scope of the present invention.

BRIEF DESCRIPTION OF THE DRAWINGS

Exemplary embodiments of the invention will be explained in more detail in the following description, and are illustrated in the drawing, in which:

FIG. 3 shows a sectioned side view (line III-III in FIG. 4) of a preferred exemplary embodiment of a compartment for holding semiconductor wafers, FIG. 4 shows a view from the front of the compartment of FIG. 3, with a plurality of wafers in it.

DESCRIPTION OF PREFERRED EMBODIMENTS

Figure 1:
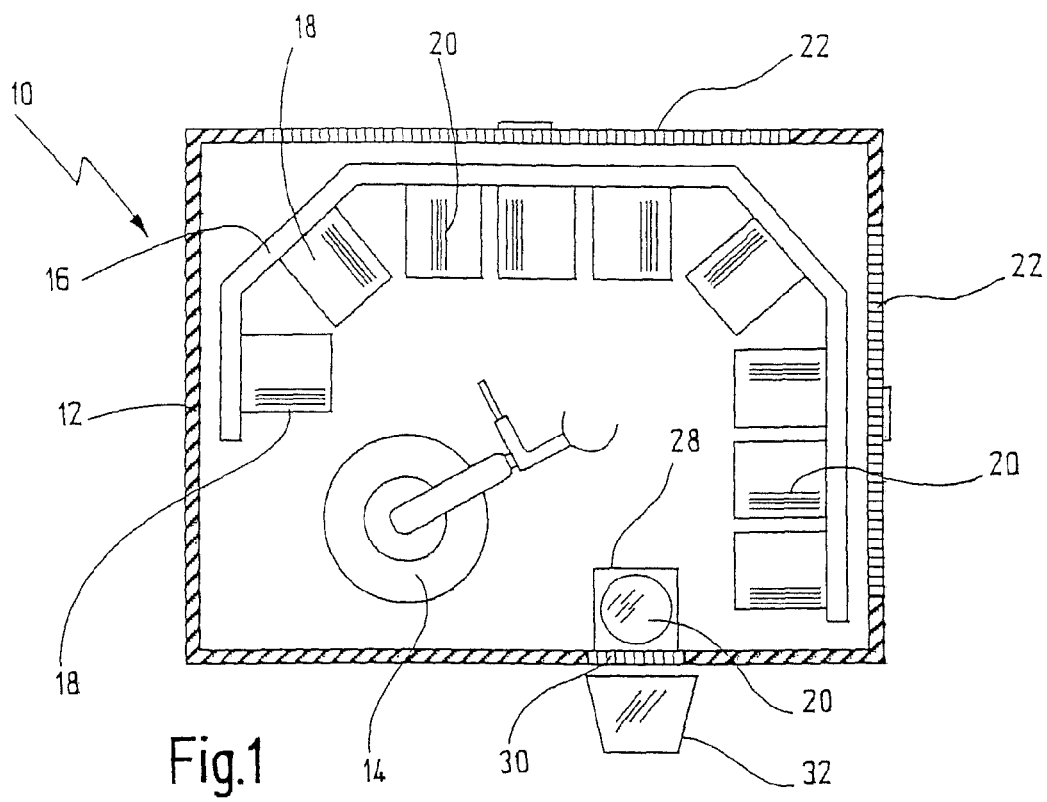
FIG. 1 shows a simplified, sectioned plan view of an exemplary embodiment of the novel apparatus.
Figure 2:
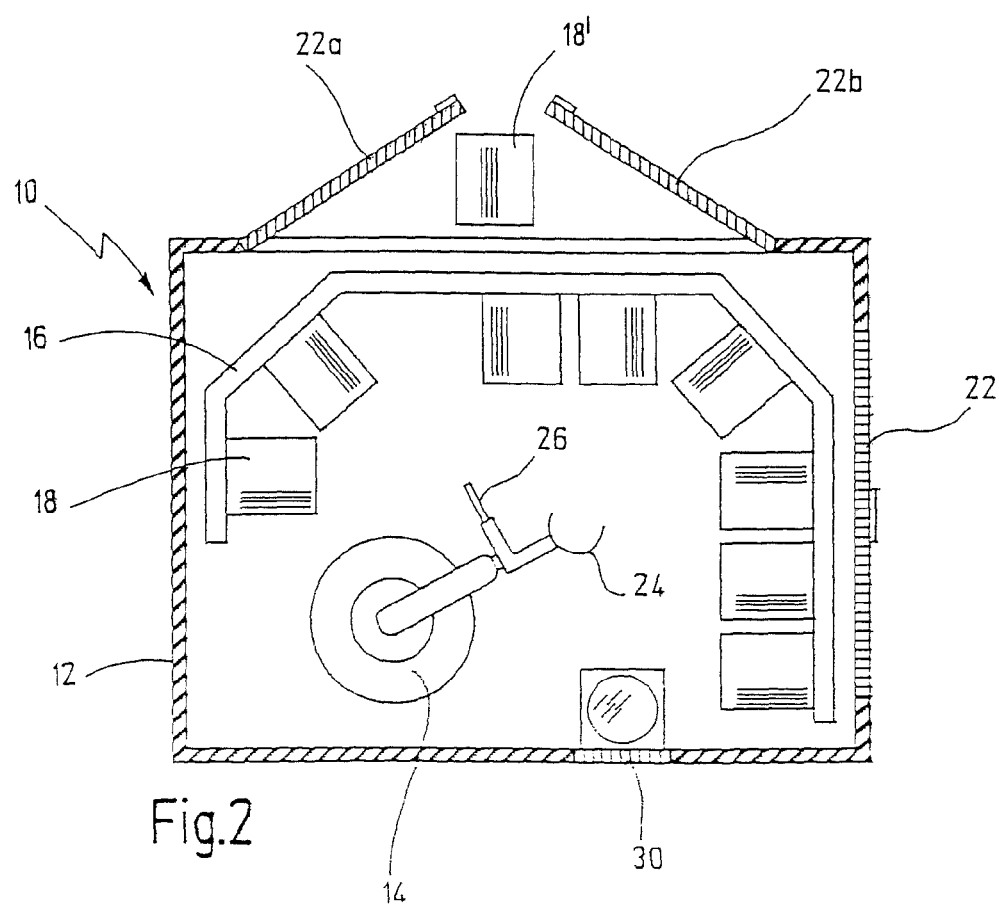
FIG. 2 shows the apparatus shown in FIG. 1, with a door for manual removal of a compartment open.

In FIGS. 1 and 2, an exemplary embodiment of the novel apparatus is designated in its entirety by reference number 10. The apparatus 10 has a closed housing 12 in whose interior a handling unit 14 and a mounting rack 16 having a plurality of compartments 18 are arranged. The housing 12 surrounds the handling unit 14, the mounting rack 16 and the compartments 18 completely, so that the interior of the housing 12 is sealed from the outside world. Filter units as well as a fan are arranged in a manner known per se on the upper face of the housing 12 (not illustrated here) in order to produce an air flow from the top downwards within the housing 12, creating a clean-room atmosphere.

Each compartment 18 is designed to hold a plurality of contamination-sensitive articles. In the preferred exemplary embodiment, the articles are semiconductor wafers 20 which are aligned vertically in the compartments 18. In a preferred exemplary embodiment, each compartment can hold 100 wafers with a diameter of 300 mm. The relative distance between the stored wafers is in this case about 2.5 mm.

The handling unit 14 in this exemplary embodiment is a 6-axis robot, which is arranged in a corner of the housing 12. The mounting rack 16 with the compartments 18 surrounds the handling unit 14 in a C-shape. In this case, the limbs of the mounting rack 16 run largely parallel to the inner walls of the surrounding housing 12. Reference number 22 denotes two doors in the side walls of the surrounding housing 12, through which the compartments 18 can be accessed manually from the rear. Figure schematically 2 illustrates how a compartment 81 which is detachably attached to the mounting rack 16 can be removed through one of the doors 22. In a situation where the wafers mounted in the compartment 81 are still to be kept in clean room conditions during removal, a mobile clean room or a corresponding tent (not illustrated here) can be fitted to the surrounding housing 12 before removal of the compartment 81.

The handling unit 14 in this exemplary embodiment has a first gripping arm 24 and a second gripping arm 26, which will be explained in more detail further below with reference to FIG. 5. Reference number 28 denotes a rest on which a wafer 20 can be placed in a horizontal direction. The rest is preferably a so-called pre-aligner with a Cognex reader. The pre-aligner aligns a wafer placed on it exactly in a defined position. The Cognex reader reads the wafer identification in a manner known to the skilled person.

Reference number 30 denotes a flap through which a FOUP 32 can be loaded with wafers 20 in a manner known per se. Conversely, wafers 20 can be removed from the FOUP 32 through flap 30, and can be placed in the apparatus 10.

FIGS. 3 and 4 show two views of a preferred exemplary embodiment of a compartment 18. Same reference symbols denote the same elements as before.

The compartment 18 has a rear wall 38, a bottom wall 40 and two side walls 42, 44 which, according to a preferred exemplary embodiment, each are sealed (such that air cannot pass through). However, an opening is left free in the corner area between the rear wall 38 and the bottom wall 40, i.e. the rear wall 38 and the bottom wall 40 are not directly adjacent to one another. The opening 46 allows air 48 to flow largely without any vortices obliquely from above obliquely downwards through the compartment 18 and thus past the vertically arranged wafers 20. Despite the relatively short distance between the individual wafers 20, the air 48 flows through between the individual wafers 20 and ensures that any particles and extraneous substances are removed obliquely downwards from the compartment 18.

In this exemplary embodiment, four slotted holders 50, 52, 54, 56 in the form of comb-like strips are arranged within the compartment 18. The slotted holders 50-56 are designed such that they can hold a wafer 20 with a diameter of D=330 mm aligned vertically. As is shown in FIG. 3, the slotted holders 50-56 hold the wafer 20 essentially on its lower and rear edge, as a result of which it is very simple to remove it using the handling unit 14. The external dimensions of the compartment 18 in this exemplary embodiment are approximately $d_1$=330 mm, $d_2$=330 mm and $d_3$=280 mm.

As can be seen from the side view in FIG. 3, the side walls 42, 44 in the front, upper corner area (that is to say approximately diametrically opposite the opening 46) have a recess 58 in which a holding bracket 60 can optionally be placed. As long as the compartments 18 are mounted on the mounting rack 16, the holding bracket 60 is not required, and is therefore not arranged in the recess 58. However, when it is desired to remove a compartment 18 from the mounting rack 16, the holding bracket 60 is placed in the recess 58 in order to prevent the wafers 20 from falling out of the compartment 18. In a particularly preferred embodiment, each compartment 18 has a handle (not shown here) which is connected to the holding bracket 60, in such a way that the handle can be used to remove a compartment 18 only when the holding bracket 60 is arranged in the recess 58.

Figure 5:
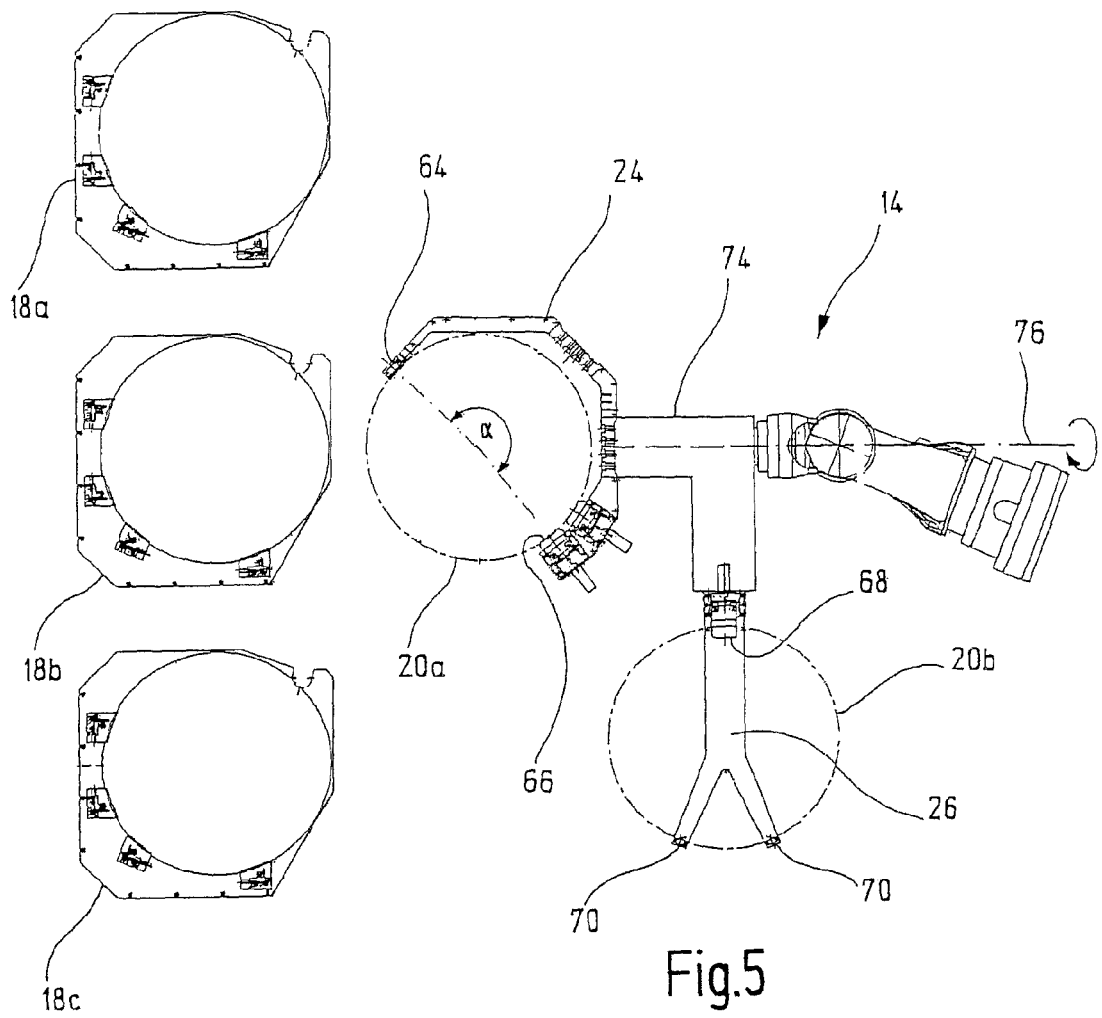
FIG. 5 shows a simplified illustration of a part of a preferred exemplary embodiment of a handling unit for loading and unloading the compartments.
Figure 6:
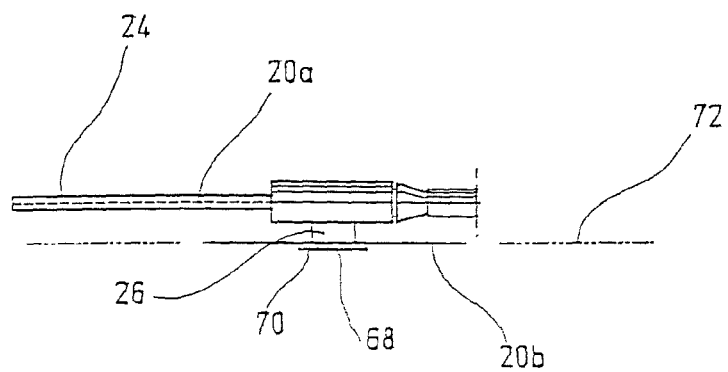
FIG. 6 shows a simplified illustration of the handling unit of FIG. 5, in an operating position pivoted through 90° with respect to FIG. 5.

FIGS. 5 and 6 show details of the handling unit 14 in more detail. Same reference symbols denote the same elements as before.

As mentioned above, the handling unit 14 has a first gripping arm 24 and a second gripping arm 26. In this case, the first gripping arm 24 is in the form of gripping tongs or legs, by means of which a wafer 20a in a vertical orientation can be gripped at the edges. The gripping tongs 24 surround the wafer 20a on its external circumference, approximately in a C-shape. First gripping elements 64, 66 are arranged at the free ends of the gripping tongs 24. As is illustrated in FIG. 5, the gripping tongs 24 surround the wafer 20a along a circular arc or circumferential area which covers an angle range a of more than 180°. The first gripping element 64, 66 can therefore hold the wafer 20a without clamping it firmly and essentially solely by the force of gravity. In order to hold and to place a wafer 20a in one of the compartments 18, the first gripping elements 64, 66 can be opened, with only the gripping elements 66 being movable in this preferred exemplary embodiment.

In the present case, the second gripping arm 26 has a Y-shaped arm part where two gripping elements 68, 70 are arranged at the ends. As is illustrated in FIG. 6, the second gripping elements 68, 70 define a plane 72 which is located underneath the arm part. A wafer 20b is held on the plane 72 by means of the gripping elements 68, 70. In contrast, the wafer 20a in the gripping tongs 24 is held on a plane which is defined by the gripping tongs 24. The circumferential area of the wafer 20b on the second gripping arm 26 is largely free, which makes it possible to place the wafer 20b directly in a FOUP 32, and to remove it from a FOUP 32, by means of the second gripping arm 26. Wafers 20 can therefore be stacked horizontally one on top of the other by means of the second gripping arm 26, as well.

In the illustrated exemplary embodiment, the gripping tongs 24 and the second gripping arm 26 are arranged adjacent to the free ends of an L-shaped mounting bracket 74. The mounting bracket 74 can rotate about an axis 76 which is coaxial with respect to that limb of the mounting bracket 74 on which the first gripping arm 24 is arranged. This makes it possible to remove a wafer 20a aligned vertically from one of the compartments 18 and to move it to the horizontal alignment, by rotating the arm through 90° about the axis 76. When aligned horizontally, the wafer 20a can be placed on the rest 28 where it is then picked up by the second gripping arm 26, and is moved into a FOUP 32. Conversely, a horizontally aligned wafer 20b can be removed from a FOUP 32 and placed on the rest 28, from where it is picked up by means of the gripping arm 24 and is moved to a vertical alignment, in order to place it in one of the compartments 18.

As is shown by an arrow 62 in FIG. 4, the slotted holders 50-56 each are in the form of comb-like strips which can be moved in a longitudinal direction 62. This means that it is possible to align the holders 50-56 with respect to one another such that the wafers 20 are kept aligned vertically without being tilted in the holders 50-56, even if the slot width of the holders 50-56 is slightly greater than the thickness of the individual wafers 20.

In the illustrated exemplary embodiments, the apparatus 10 is highly suitable for storing wafers. In particular, the separate ("bare") storage of the wafers means that there is no need for a sorter, since the apparatus 10 together with the described handling unit 14 is able to place wafers 20 from any desired compartments 18 in one FOUP 32. The novel apparatus 10 can advantageously be used if it is combined with a so-called FOUP stocker, i.e. a storage system for FOUPs. In this refinement, FOUPs can be filled with wafers 20 completely automatically without any need for the previously required sorter. This allows a high storage capacity with small space requirements because of the vertical storage of the wafers and the high packing density associated with this. Storage of the individual wafers in separate compartments in the form of boxes also ensures that cross-contamination between different wafers 20 is largely precluded, despite the "open" storage.

Same reference symbols denote the same elements as before in the following description of further exemplary embodiments.

Figure 7:
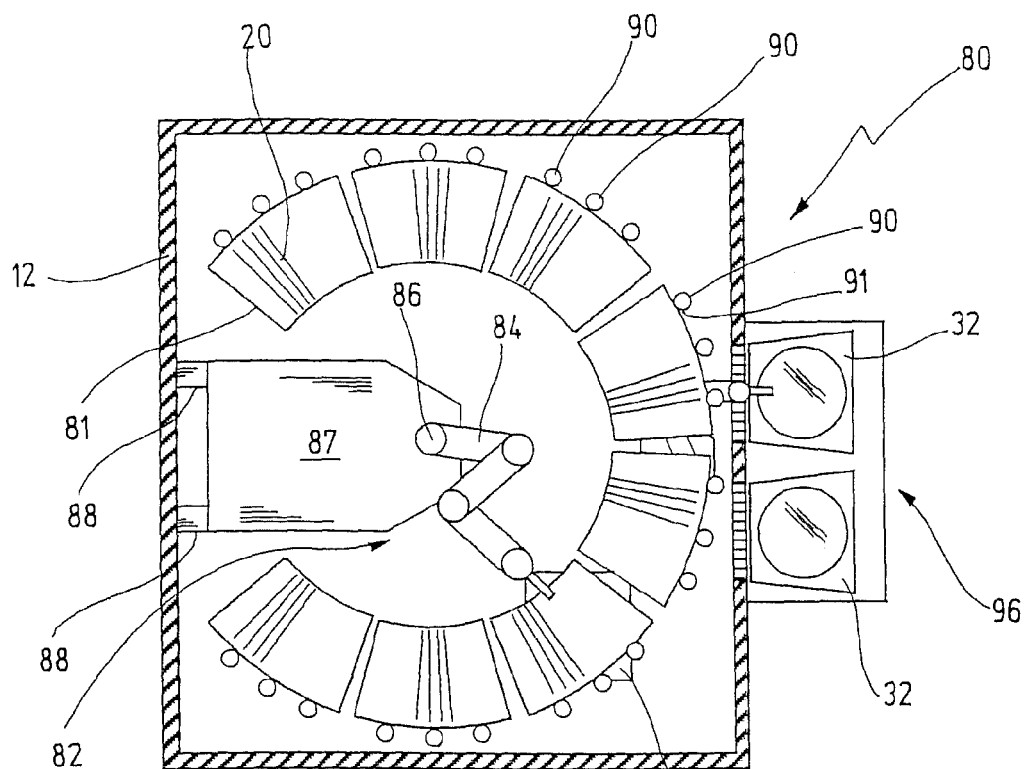
FIG. 7 shows a simplified illustration in the form of a sectioned plan view of a further exemplary embodiment of the novel apparatus.
Figure 8:
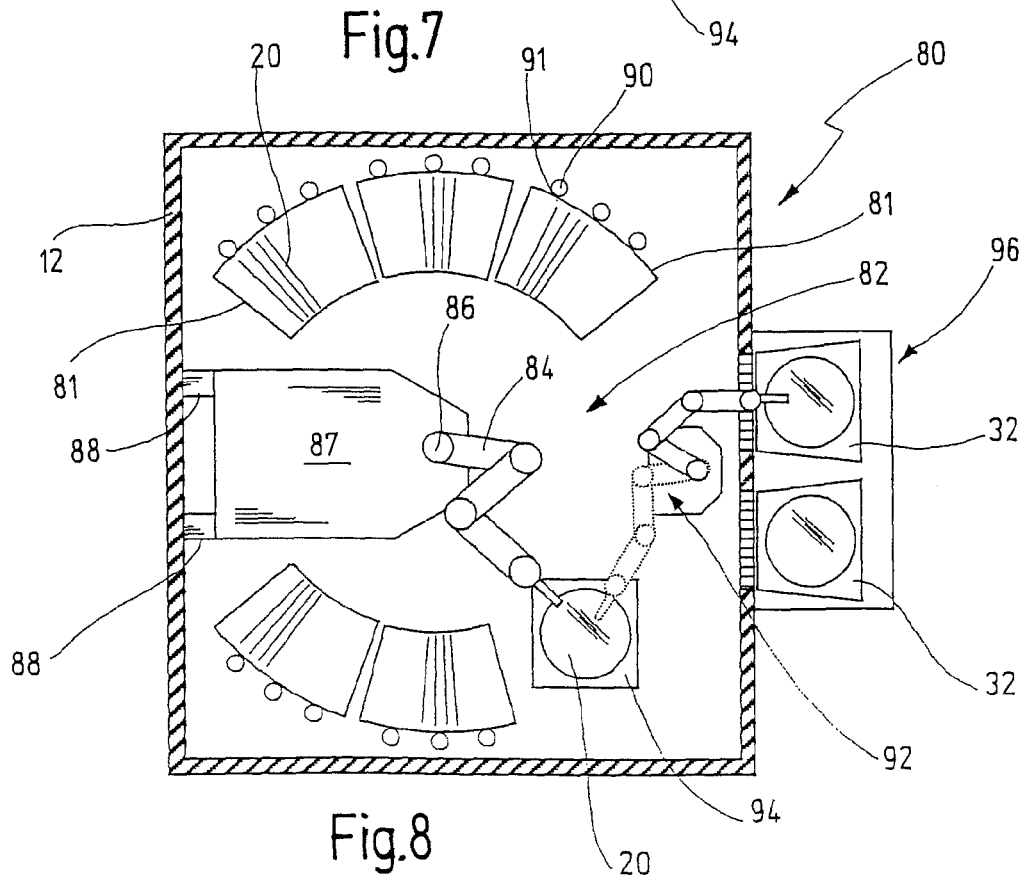
FIG. 8 shows a section plane underneath the section plane shown in FIG. 7 of the apparatus shown in FIG. 7.

FIGS. 7 and 8 show a preferred exemplary embodiment of the novel apparatus, which is designated with reference number 80 in its totality. In the apparatus 80, a plurality of compartments 81 surround a handling unit 82 in a circular form. The handling unit 82 is in this case a SCARA robot with an articulated arm 84 which can be moved only radially on a horizontal plane parallel to the plane of the illustration in FIGS. 7 and 8. The articulated arm 84 is mounted such that it can rotate at the center point of a circle 86, which is defined by the circular arrangement of the compartments 81. The articulated arm 84 can therefore carry out movements within the horizontal plane and radially with respect to the center point of the circle 86. The articulated arm 84 is well suited for removing articles 20, in particular semiconductor wafers, in the radial direction from the compartments 81, and for placing them in the compartments 81.

Figure 9:
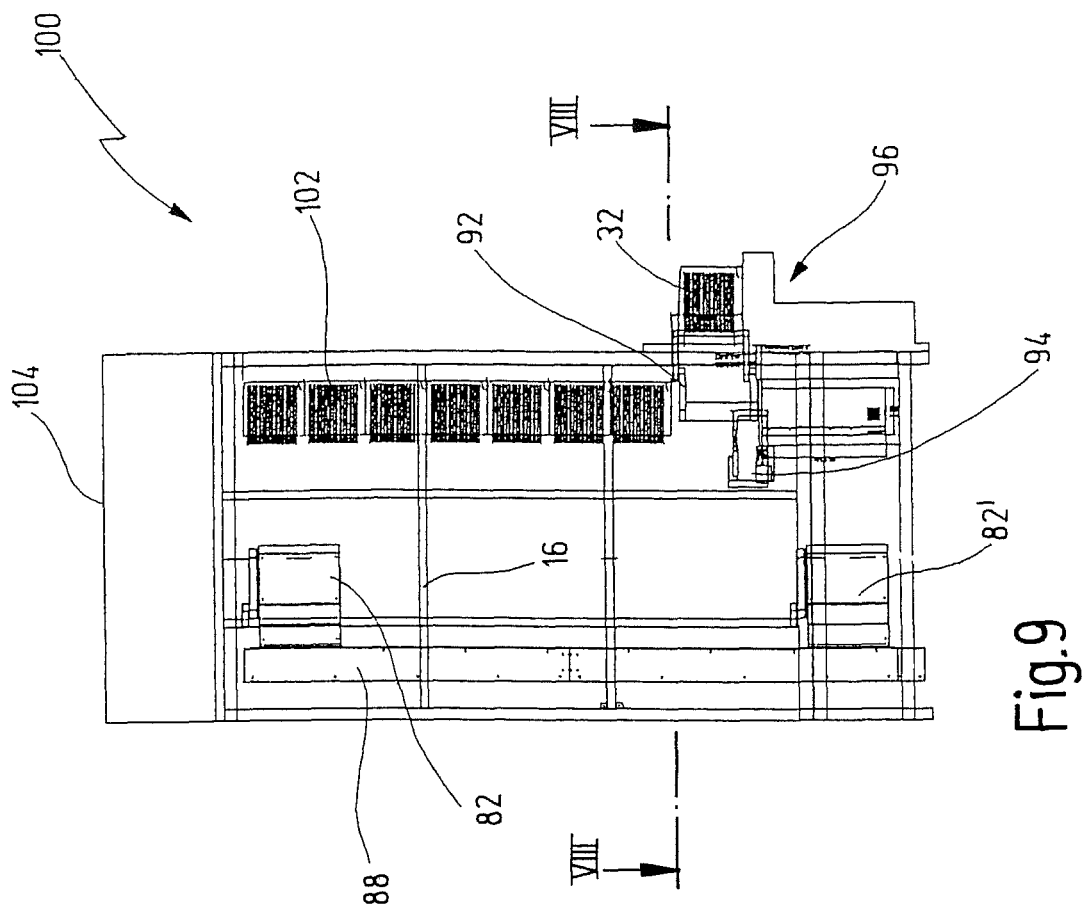
FIG. 9 shows a further exemplary embodiment of the novel apparatus, in the form of a simplified, partially sectioned side view.
Figure 10:
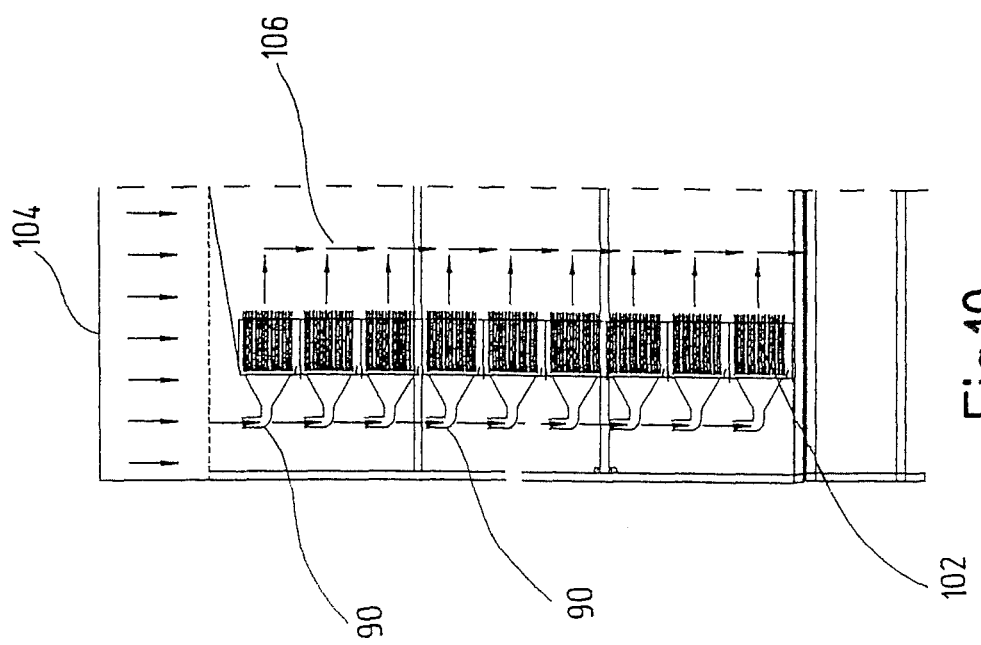
FIG. 10 shows a view of a part of the exemplary embodiment from FIG. 9.

Furthermore, in the apparatus 80, a plurality of compartments 81 are arranged one above the other, in a similar manner to that illustrated in FIGS. 9 and 10 in the form of a side view of a similar exemplary embodiment. In order to allow the handling unit 82 to access the various vertical planes of the compartments 81, the SCARA robot is mounted by means of the articulated arm 84 on a carriage 87 which can be moved along two guide rails 88 in the vertical direction (that is to say at right angles to the plane of the illustration in FIGS. 7 and 8).

In this case, the compartments 81 are designed in a similar manner to the compartments 18 shown in FIGS. 3 and 4. In particular, they are designed to hold wafers 20 in a vertical orientation. In contrast to the previous embodiment, the compartments 81 in this case, however, have a profile in the form of a circular ring in a plan view, so that arrangement of the compartments 81 side by side results in a circular ring. Each compartment 18 is therefore broader on its outside, facing away from the handling unit 82, than on its inside, facing the handling unit 82. Furthermore, the wafers 20 are arranged in a V-shape in the compartments 81. Each wafer 22 is aligned with the center point of the circle 86. This arrangement of the wafers 20 results in a nozzle effect when a cleaning gas flows through the compartments 81 from the outside inwards.

The compartments 81 in this exemplary embodiment advantageously have connections 90 for supplying the cleaning gas. In this case, the connections 90 are arranged on the broader rear face of the compartments 81, so that the compartments 81 can be purged with the cleaning gas from the rear face. Furthermore, each connection 90 has a valve 91 (not illustrated in more detail) by means of which the connections 90 can be selectively opened or closed. It is therefore possible to purge the compartments individually with cleaning gas, which is particularly advantageous when the compartments 81 have different loads.

FIG. 8 shows a plan view of the apparatus 80 along a section plane which approximately corresponds to the section plane VIII-VIII from FIG. 9. As can be seen from the plan view in FIG. 8, some of the compartments 81 may "be missing" in the lower layers of the apparatus 80. A second handling unit 92 and a pre-aligner 94 are arranged in the free space created in this way.

The first handling unit 92 is designed to place a wafer 20 which has been taken from the compartment 81 on the pre-aligner 94. For this purpose, the handling unit 82 is able to move a wafer which has been taken from the compartments 18 aligned vertically to a horizontal position, and to place it on the pre-aligner 94. The pre-aligner 94 precisely aligns the wafer 20 in a horizontal position. The wafer 20 is then gripped by the second handling unit 92 and is then placed in an input/output station 96 in a FOUP 32. It is self-evident that the input/output station 96 has an air-tight connection to the surrounding housing 12 of the apparatus 80, so that the wafer 20 can be inserted into the FOUP 32 without contamination. Conversely, the second handling unit 92 can remove a wafer 20 from the FOUP 32 at the input/output station, and can place it on the pre-aligner 94. From there, the wafer 20 is picked up by the first handling unit 82, and is placed in one of the compartments 81.

As is illustrated in a simplified form in FIGS. 7 and 8, the second handling unit 92 is in this case likewise a SCARA robot with a articulated arm, which can be moved only on a horizontal plane and radially with respect to the center point of a circle.

In the exemplary embodiment shown in FIGS. 7 and 8, the input/output station 96 has two holders for loading a FOUP 32. This is advantageous because the apparatus 80 in consequence carries out the function of a sorter, that is to say it is able to move wafers 20 from one FOUP 32 to another FOUP 32, and if necessary to reorganize them.

FIG. 9 shows a further exemplary embodiment of the novel apparatus, which is annotated in its totality with the reference number 100. Same reference symbols denote the same elements as before.

In principle, the apparatus 100 is identical to the apparatus 80 shown in FIGS. 7 and 8, that is to say it has a plurality of compartments which are arranged vertically one above the other and in a circular shape around a handling unit 82. The only difference from the apparatus 80 in this case is that the wafers 20 are mounted in the compartments 102 with a horizontal orientation. This avoids the need for the handling unit 82 to have to rotate the wafers 20 through 90° when they are being inserted into and removed from the compartments 102. Apart from this, the apparatus 100 corresponds to the apparatus 80 shown in FIGS. 7 and 8.

In order to illustrate the movement path of the first handling unit 82, the first handling unit 82 is in this case illustrated in two vertical limit positions, one of which is annotated with the reference number 82'.

The view from the side shown in FIG. 9 illustrates that the apparatus 100 (in the same way as the apparatus 80) has a fan and filter unit 104 at the top, producing a flow of cleaning gas, in particular filtered air, through the interior of the surrounding housing 12. As illustrated in the form of a view of part of it in FIG. 10, the fan and filter unit 104 suck in environmental air above the apparatus 100. The environmental air that is sucked in is cleaned and dried, and is then passed into the interior of the surrounding housing. In the illustrated exemplary embodiment, the cleaned air is passed via connections 90 on the rear face of the individual compartments 102, and is passed from there into the individual compartments 102. The air flow of the clean gas thus enters on the rear face of the compartments 102, emerges on the open front face of the compartments 102, and flows downwards from there, as is illustrated in a simplified form by the reference number 106 in FIG. 10. As has been explained further above, this flow direction results in a nozzle effect with vertical storage, further enhancing the cleaning effect. However, good through-flow can also be achieved with horizontal storage, as is illustrated in FIGS. 9 and 10. Furthermore, in principle, it is also possible to purge the wafers from the inside outwards, as is the case in the exemplary embodiments shown in FIGS. 1 to 5.

As has already been explained using examples in FIGS. 7 to 10, individual features of the illustrated exemplary embodiments can also be combined with one another. For example, it is therefore possible to use an apparatus as is illustrated in FIGS. 1 and 2 for storing wafers aligned horizontally, provided that the compartments 18 are appropriately designed. Although vertical storage is preferable because of the higher packing density and the better air flow, there are some users who prefer horizontal storage. Furthermore, the compartments 18 in FIGS. 1 and 2 may also be provided with connections 90 in order to achieve an individual flow through the compartments. The connections are then preferably arranged in the upper front area of the compartments. Conversely, the compartments 81 and 102 in the exemplary embodiments shown in FIGS. 7 to 10 can also have a flow path from the inside outwards, as has been explained with reference to FIGS. 3 and 4. Furthermore, for example, it is possible to combine a circular arrangement of compartments with a 6-axis robot as the handling unit.

Finally, for the sake of completeness, it should be mentioned that the present invention can also be used for storing other contamination-sensitive flat articles, such as reticles. It is self-evident that the box-like compartments 18 with the slotted holders 50-56 should then be matched to the external dimensions of the reticles. In the same way, the gripping elements of the handling unit 14 should be matched to the external dimensions of the reticles.

What is claimed is:

1. An apparatus for storing contamination-sensitive flat articles, the apparatus comprising:
a plurality of box-like compartments each having an open front side and enclosed side, top and bottom sides, the compartments being stationary arranged in rows and columns side by side and one above the other on a fixed mounting rack, and the compartments each having a plurality of slotted stationary holders for receiving a plurality of flat articles so that the articles are stationary arranged within the compartments,
a first handling unit for automatically inserting and removing a flat article into and out of the slotted holders, and
a closed housing forming a clean room where both the compartments and the first handling unit are arranged,
wherein the articles arranged within any one compartment are separated by said enclosed sides from the articles arranged within adjacent compartments so that a contaminated article in an adjacent compartment arranged above, below, or alongside said one compartment will not contaminate the articles in said one compartment, and further
wherein the plurality of compartments surround the first handling unit on at least two sides and are arranged in the mounting rack so that the open front side of each compartment is accessible to the first handling unit enabling the first handling unit to selectively insert a flat article into or remove a flat article from any one of said plurality of slotted holders in any one of said plurality of compartments without removing the compartments from the mounting rack.

2. The apparatus of claim 1, wherein the slotted holders are configured to hold the flat articles in a horizontal orientation in the compartments.

3. The apparatus of claim 1, wherein the slotted holders are configured to hold the flat articles in a vertical orientation in the compartments.

4. The apparatus of claim 1, wherein the plurality of compartments surround the first handling unit in a substantially circular shape.

5. The apparatus of claim 4, wherein the plurality of compartments define a center point of a circle, with the first handling unit being arranged in the vicinity of the center point.

6. The apparatus of claim 4, wherein the slotted holders are configured to hold the flat articles in alignment with the center point.

7. The apparatus of claim 1, wherein the handling unit comprises a carriage and an articulated arm arranged on the carriage, with the articulated arm being configured to move on a substantially horizontal plane only, and with the carriage configured to move in a vertical direction.

8. The apparatus of claim 1, wherein the handling unit is a 6-axis robot.

9. The apparatus of claim 1, further comprising a second handling unit configured to transfer a flat article into the closed housing or out of the closed housing.

10. The apparatus of claim 1, wherein the first handling unit comprises a first gripping arm having at least two first gripping elements for holding a flat article, the first gripping arm being configured to rotate between a horizontal and a vertical holding position.

11. The apparatus of claim 10, wherein the first gripping arm comprises a first and a second leg each having a free end, with the at least two first gripping elements being arranged on the free ends, and wherein the first and second legs cover a circular arc with an angle range of more than 180°.

12. The apparatus of claim 10, wherein the first handling unit comprises a second gripping arm supporting at least two second gripping elements, with the second gripping elements defining a plane, and with the second gripping arm being arranged outside from the plane.

13. The apparatus of claim 12, wherein the first handling unit comprises a substantially L-shaped mounting bracket having a first and a second end, with the first gripping arm being arranged on the first end and the second gripping arm being arranged on the second end.

14. The apparatus of claim 1, wherein the closed housing has at least one door configured to allow direct access to the compartments.

15. The apparatus of claim 1, wherein each compartment has side walls, a bottom wall and a rear wall, which are arranged substantially transverse with respect to one another.

16. The apparatus of claim 15, wherein the bottom wall and the rear wall are arranged with an opening remaining in the area between the rear wall and the bottom wall.

17. The apparatus of claim 1, wherein each compartment comprises a connection for supplying a stream of cleaning gas.

18. The apparatus of claim 1, wherein each compartment comprises a locking element for securing the articles in the holders against falling out.

19. The apparatus of claim 1, wherein the slotted holders are in the form of elongated comb-like strips capable of being moved in a longitudinal direction.

20. The apparatus of claim 1, wherein the compartments including the slotted holders are configured for holding semiconductor wafers.

21. An apparatus for storing contamination-sensitive flat articles, the apparatus comprising:
  a plurality of box-like compartments each having an open front side and enclosed side, top and bottom sides, the compartments being stationary arranged in rows and columns side by side and one above the other on a fixed mounting rack, and the compartments each having a plurality of slotted stationary holders for receiving a plurality of flat articles so that the articles are stationary arranged within the compartments,
  a first handling unit for automatically inserting and removing a flat article into and out of the slotted holders, and
  a closed housing forming a clean room where both the compartments and the first handling unit are arranged,
  wherein the articles arranged within any one compartment are separated by said enclosed sides from the articles arranged within adjacent compartments so that a contaminated article in an adjacent compartment arranged above, below, or alongside said one compartment will not contaminate the articles in said one compartment, and further
  wherein the first handling unit is arranged in a central handling area of the housing, and further
  wherein the plurality of compartments surround the first handling unit on at least two sides and are arranged in the mounting rack so that the open front side of each compartment faces toward the central handling area of the housing.

* * * * *